United States Patent [19]

Shiramizu

[11] 4,443,887

[45] Apr. 17, 1984

[54] FREQUENCY-DIVIDING CIRCUIT

[75] Inventor: Takami Shiramizu, Yokohama, Japan

[73] Assignee: Victor Company of Japan, Ltd., Yokohama, Japan

[21] Appl. No.: 272,831

[22] Filed: Jun. 12, 1981

[30] Foreign Application Priority Data

Jun. 16, 1980 [JP] Japan .................. 55-81041

[51] Int. Cl.³ ........................... H03K 21/36
[52] U.S. Cl. ..................... 377/110; 377/48; 377/114
[58] Field of Search .............. 377/48, 66, 108, 110, 377/114

[56] References Cited

U.S. PATENT DOCUMENTS

| 3,096,483 | 7/1963 | Ransom | 377/110 |
|---|---|---|---|
| 3,976,946 | 8/1976 | Schroder | 377/48 |
| 4,041,403 | 8/1977 | Chiapparoli | 377/48 |
| 4,150,337 | 4/1979 | Sheller | 377/114 |
| 4,331,926 | 5/1982 | Minakuchi | 377/110 |

FOREIGN PATENT DOCUMENTS

| 1107431 | 3/1968 | United Kingdom . |
|---|---|---|
| 1432513 | 4/1976 | United Kingdom . |
| 1463619 | 2/1977 | United Kingdom . |
| 1470135 | 4/1977 | United Kingdom . |
| 1534591 | 12/1978 | United Kingdom . |
| 2007892 | 5/1979 | United Kingdom . |
| 1547267 | 6/1979 | United Kingdom . |
| 1575664 | 9/1980 | United Kingdom . |

*Primary Examiner*—John S. Heyman
*Attorney, Agent, or Firm*—Ladas & Parry

[57] ABSTRACT

A frequency-dividing circuit comprises an asynchronous counter having a plurality of one-half frequency-dividers connected in series in a plurality of stages in which a master clock signal is applied to an input terminal of the initial stage, for asynchronously producing output signals of each of the one-half frequency-dividers, where the asynchronous counter is set with a preset data n (n is an integer) which is preset according to a desired frequency-dividing ratio when a load pulse is applied, a coincidence detection circuit for detecting the coincidence of a plurality of outputs supplied from the asynchronous counter, and a frequency-divided output signal and load pulse generation circuit supplied with the master clock signal and an output signal of the coincidence detection circuit, for generating a frequency-divided output signal and a load pulse. The frequency-divided output signal and load pulse generation circuit supplies a load pulse to the asynchronous counter.

7 Claims, 5 Drawing Figures

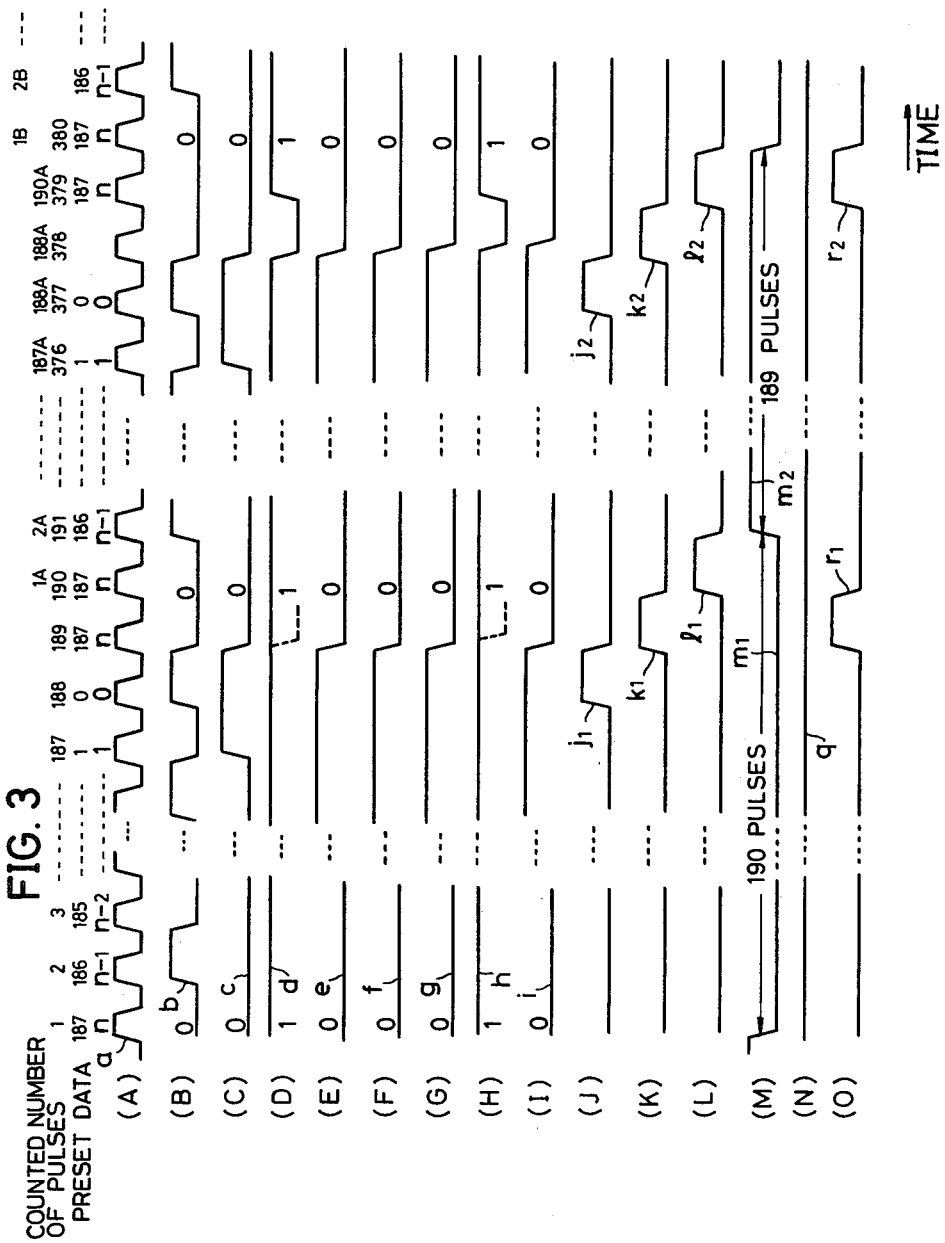

FREQUENCY-DIVIDING CIRCUIT

BACKGROUND OF THE INVENTION

The present invention generally relates to frequency-dividing circuits, and more particularly to a frequency-dividing circuit capable of obtaining a frequency-divided output signal, which is of a simple circuit construction comprising a relatively small number of circuit elements such as asynchronous counters and shifting circuits which can be manufactured at low cost.

Generally, in electronic instruments such as an electronic organ, the notes C, B, A#,—, D#, D, and C# of the musical scale, are obtained by frequency-dividing a master clock signal of 2.008448 MHz, for example, by use of a number of frequency-dividing circuits corresponding to the number of notes, where each of the frequency-dividing circuits has a frequency-dividing ratio corresponding to each note of the musical scale. These frequency-divided signals respectively having a frequency respective of each note in the musical scale, are further successively frequency-divided into one-half the original frequency at a plurality of stages. Accordingly, the signals having frequencies respectively corresponding to each note of the musical scale, that is, each key of the electronic organ, are respectively obtained from each of the one-half frequency-dividing circuits.

In the above described circuit, the frequency-dividing circuit having a frequency-dividing ratio corresponding to the E note of the musical scale, for example, is a 379-count counter which obtains a signal in which one period is an interval consisting of 379 pulses of a master clock signal. Similarly, the frequency-dividing circuit having a frequency-dividing ratio corresponding to the D# note of the musical scale, is a 402-count counter which obtains a signal in which one period is an interval consisting of 402 pulses of the master clock signal. However, in the above example of the frequency-dividing circuit which has a frequency-dividing ratio of 1/379 (the 379-count counter), one-half the period corresponds to 189.5 pulses of the master clock signal, since the denominator of the frequency-dividing ratio when the ratio is represented in a form of unity over a number is of an odd value, namely, 379. Accordingly, in this case, it becomes necessary to detect the timing for the above interval corresponding to 0.5 pulse of the master clock signal. Therefore, in the conventional frequency-dividing circuit, the timing corresponding to the above interval of 0.5 pulse is obtained by switching the rising edge and the failing edge of the master clock signal immediately before the pulses corresponding to one-half the period are counted. However, the construction of the logic circuit which obtains the above timing to perform the switching becomes complex. Moreover, when the frequency-dividing ratio is multiplied by two together with the master clock signal, it becomes unnecessary to detect the timing for the interval corresponding to 0.5 pulse of the master clock signal, however, it becomes difficult for the operations of the circuits which comprise the frequency-dividing circuits to follow the master clock signal. Hence, in extreme cases, the operations of the circuits which comprise the above frequency-dividing circuits do not follow the master clock signal.

On the other hand, a frequency-dividing circuit has been proposed which uses a synchronized counter comprising a plurality of stages of shift registers simultaneously supplied with a master clock signal supplied through an input terminal, a decoder circuit supplied with each output of the shift registers, and a feed-back circuit having exclusive-OR logic circuits. In this proposed circuit, a reset-and-set (R-S) flip-flop circuit which is set and reset by the output of the decoder circuit into which logic data corresponding to a desired frequency-dividing ratio is pre-established, is operated, to obtain a desired frequency-divided output. However, in this circuit, the number of logic circuits used is large compared to the case where an asynchronous counter is used, since a synchronized counter is used in this case. Accordingly, the circuit construction of the above circuit becomes complex, and suffers a disadvantage in that the circuit can not be manufactured at low cost.

SUMMARY OF THE INVENTION

Accordingly, a general object of the present invention is to provide a novel and useful frequency-dividing circuit in which the above described problems have been overcome.

Another and more specific object of the present invention is to provide a frequency-dividing circuit capable of obtaining a frequency-divided output by use of a simple circuit construction comprising a relatively small number of elements such as an asynchronous counter and a shifting circuit, and using a signal which strictly does not have a duty cycle of 50% by ignoring an interval corresponding to 0.5 pulse which becomes necessary when obtaining an odd frequency-dividing ratio (the expression "odd frequency-dividing ratio" means that the frequency-dividing ratio is represented by a reciprocal of an odd integer). According to the circuit of the present invention a frequency-divided output can be obtained which does not introduce any problems when heard through a human ear, although a signal is used which strictly does not have a duty cycle of 50% by ignoring an interval corresponding to 0.5 pulse which becomes necessary when obtaining the odd frequency-dividing ratio. Further, the operation of the circuit of the present invention is simple, since the data which is to be preset into the asynchronous counter can be programmed more easily as compared to the case where a synchronous counter is used.

Other objects and further features of the present invention will be apparent from the following detailed description when read in conjunction with the accompanying drawings.

BRIEF DESCRIPTION OF THE DRAWINGS

FIGS. 3 (A) through 3 (O) respectively are time charts for explaining the operation of the circuit according to the present invention;

DETAILED DESCRIPTION

In the present specification, the expression "odd (even) frequency-division" and "odd (even) frequency-dividing ratio" respectively means that the frequency-dividing ratio is represented by a reciprocal of an odd (even) integer.

Figure 1:
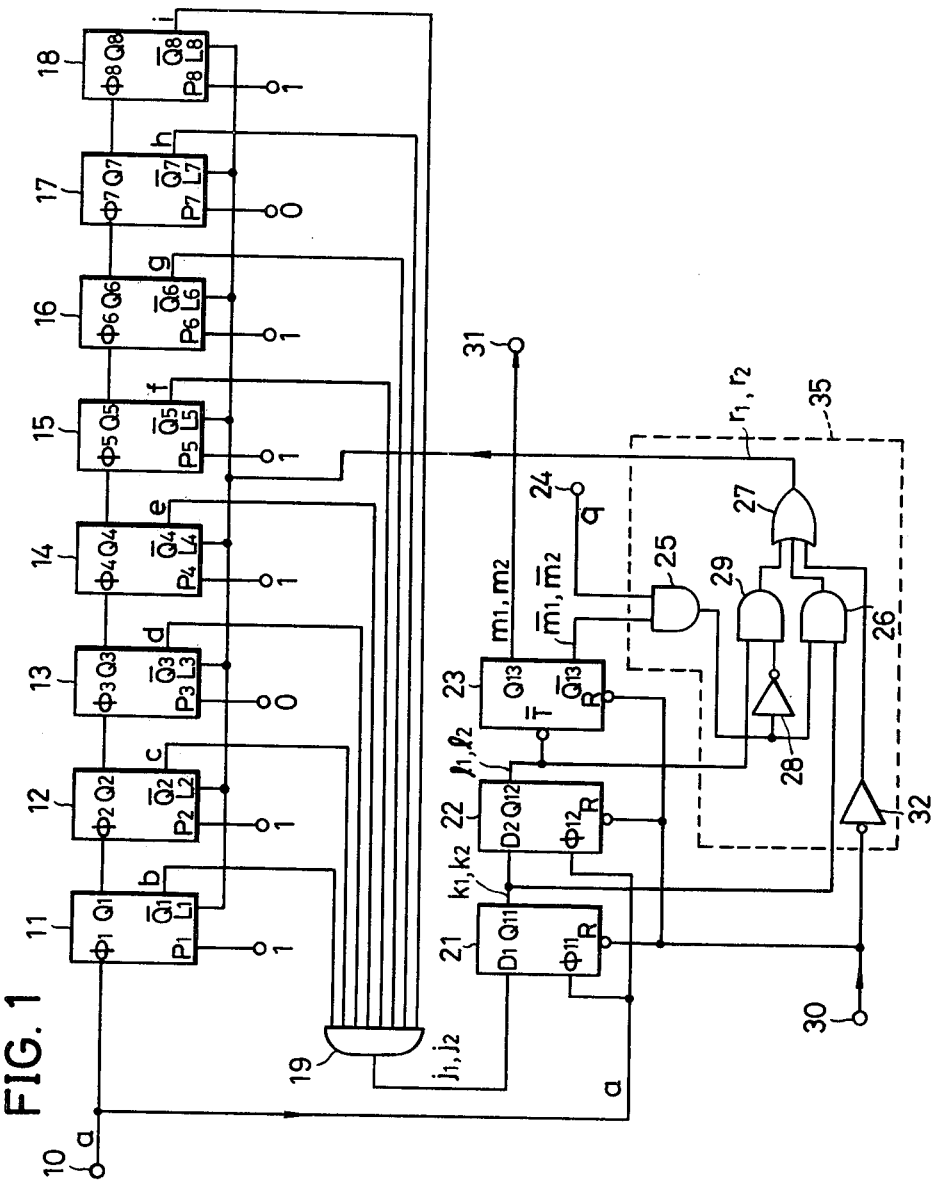
FIG. 1 is a circuit diagram showing an embodiment of a frequency-dividing circuit according to the present invention.
Figure 2:
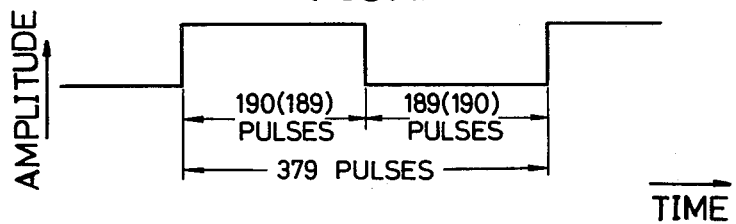
FIG. 2 is a diagram for explaining the number of output pulses obtained by a circuit according to the present invention in which the denominator of the frequency-dividing ratio is an odd number.

FIG. 1 is a circuit diagram showing an embodiment of a frequency-dividing circuit according to the present invention. When an odd frequency-dividing ratio is to be obtained such as a case in which an output corresponding to the notes E, G, or C of the musical scale is to be obtained by use of the circuit according to the present invention, it was perceived that no problems were introduced when the output of the frequency-dividing circuit is heard through a human ear even when a signal is used which strictly does not have a duty cycle of 50% by ignoring an interval corresponding to 0.5 pulse of a master clock signal. Accordingly, a signal shown in FIG. 2 can be obtained by use of an asynchronous counter and a shift register which can be constructed by using a small number of circuit elements.

In FIG. 1, asynchronous counters 11 through 18 respectively have count-down circuits constructed from one-half frequency-dividers. These asynchronous counters 11 through 18 are respectively connected in series, that is, an input terminal $\phi1$ of the counter 11 is connected to an input terminal 10, an output terminal Q1 of the counter 11 is connected to an input terminal $\phi2$ of the counter 12, an output terminal Q2 of the counter 12 is connected to an input terminal $\phi3$ of the counter 13, etc. Preset data input terminals P1 through P8 of the counters 11 through 18 are respectively terminals through which preset data are supplied. Load terminals L1 through L8 of the counters 11 through 18 are respectively connected to each other, and when a load pulse is applied to each of the load terminals L1 through L8, the above preset data are respectively loaded to the corresponding counters, to produce these data as outputs from the output terminals Q1 through Q8 of the counters 11 through 18. Furthermore, inverting output terminals $\overline{Q1}$ through 0VS/Q8/ of the counters 11 through 18 are respectively connected to the input side of an AND-circuit 19. This AND-circuit 19 is a circuit for detecting the coincidence of signals produced through the inverting output terminals $\overline{Q1}$ through $\overline{Q8}$ of the counters 11 through 18.

On the other hand, the input terminal 10 is connected to input terminals $\phi11$ and $\phi12$ of shift registers 21 and 22, and the output side of the above AND-circuit 19 is connected to another input terminal D1 of the shift register 21. In addition, an output terminal Q11 of the shift register 21 is connected to another input terminal D2 of the shift register 22 and to one input terminal of an AND-circuit 26 which will be described hereinafter. These shift registers 21 and 22 are for shifting the output of the AND-circuit 19. An output terminal Q12 of the shift register 22 is connected to an inverting input terminal $\overline{T}$ of a trigger (T-type) flip-flop circuit 23 and to one input terminal of an AND-circuit 29 which will be described hereinafter. The above T-type flip-flop circuit 23 produces a frequency-divided output from one output terminal Q13. On the other hand, the T-type flip-flop circuit 23 operates a logic circuit 35 with an output obtained through an inverting output terminal $\overline{Q13}$, to supply a load pulse to the respective load terminals L1 through L8 of the counters 11 through 18. Moreover, reset terminals R of the shift registers 21 and 22 and the T-type flip-flop circuit 23 are respectively connected to a reset signal input terminal 30. Accordingly, when a reset signal is supplied to the above reset signal input terminal 30, this reset signal is inverted as described below and also respectively supplied to the reset terminals R of the shift registers 21 and 22 and the T-type flip-flop circuit 23, to reset the same.

A logic circuit 35 comprises a plurality of AND-circuits and inverting circuits, and an OR circuit. One input terminal of an AND-circuit 25 within this logic circuit 35 is connected to the inverting output terminal $\overline{Q13}$ of the T-type flip-flop circuit 23, and the other input terminal of the AND-circuit 25 is connected to an odd/even number switching terminal 24. The output side of the above AND-circuit 25 is connected to the input of an inverting circuit 28 and to one input terminal of the AND-circuit 26. The other input terminal of the AND-circuit 26 is connected to the output terminal Q11 of the shift register 21 as described above. The output side of the inverting circuit 28 is connected to one input terminal of the AND-circuit 29, and the other input terminal of the AND-circuit 29 is connected to the output terminal Q12 of the shift register 22 as described above. The reset signal input terminal 30 is connected to an input of an OR-circuit 27 through an inverting circuit 32, together with the output sides of the AND-circuits 26 and 29. Moreover, the output side of the above OR-circuit 27 is connected to the load terminals L1 through L8 of the counters 11 through 18.

Next, description will be given with respect to a case where the above described circuit is applied to a frequency-dividing circuit for obtaining the E note of the musical scale by frequency-dividing a master clock signal a into 1/379 the original frequency. When the preset data which is pre-established and applied at the preset data input terminals P1 through P8 of the counters 11 through 18 is designated by n, and the denominator of the frequency-dividing ratio required is designated by N, an equation $n=(N-5/2)$ stands when the value of N is an odd number. Hence, the preset data required for the case where the E note of the musical scale is to be obtained, becomes $(379-5/2=187)$. This value "187" can be described by "10111011" in binary code. Accordingly, when the preset data of the value "187" is to be preset into the counters 11 through 18, the values "1", "1", "0", "1", "1", "1", "0", and "1" ("1" indicates a high-level signal, and "0" indicates a low-level signal) must respectively be supplied to the preset data input terminals P1 through P8. Thus, when a load pulse is supplied to the load terminals L1 through L8, output values "0", "0", "1", "0", "0", "0", "1", and "0" are respectively obtained from the inverting output terminals $\overline{Q1}$ through $\overline{Q8}$ of the counters 11 through 18, and the counters 11 through 18 are returned to their original states. Further, when the above circuit of the present invention is used as a frequency-dividing circuit where the value of N is an odd number, the level of a signal g shown in FIG. 3(N) which is supplied to the odd/even number switching terminal 24, is set at a high level.

In the circuit shown in FIG. 1, the master clock signal a having a frequency $f_a$ of 2.008448 MHz, for example, as shown in FIG. 3(A), is supplied to the input terminal $\phi1$ of the counter 11 and frequency divided into one-half the original frequency. Hence, a signal having a frequency of $f_a/2$ is produced through the output terminal Q1 of the counter 11. The output signal thus obtained through the output terminal Q1 of the counter 11, is supplied to the input terminal ∅2 of the counter 12 wherein the signal is frequency-divided into one-half the frequency of the signal supplied thereto. Accordingly, a signal having a frequency $(f_a/2)\cdot(\frac{1}{2})=f_a/4$ is obtained through the output terminal Q2 of the counter 12. Similarly, signals are successively frequency-divided in the counters 13 through 18, and a signal having a frequency of $f_a/256$ is obtained from the output terminal Q8 of the counter 18. Therefore, signals b through i respectively shown in FIGS. 3(B) through 3(I) are obtained from the inverting output terminals $\overline{Q1}$ through $\overline{Q8}$ of the counters 11 through 18.

In the above described type of a circuit, that is, a binary counter, the outputs obtained from the inverting output terminals all become "1" (high level) when the preset data is "0" (low level). Therefore, in a case where the preset data is "187", the outputs obtained from the inverting output terminals $\overline{Q1}$ through $\overline{Q8}$ of the counters 11 through 18 all become high levels, when the 188th pulse of the master clock signal is applied to the counters. Accordingly, a coincidence signal j shown in FIG. 3(J) is obtained from the AND circuit 19. This coincidence signal j thus obtained, is successively shifted by the shift registers 21 and 22, and signals k1 and l1 respectively shown in FIGS. 3(K) and 3(L) are respectively obtained through the output terminals Q11 and Q12 of the shift registers 21 and 22.

The T-type flip-flop circuit 23 is triggered at the falling edge of the signal l1 supplied from the shift register 22, and as shown in FIG. 3(M), a frequency-divided output m1 of the T-type flip-flop circuit 23 is switched over to a frequency-divided output m2. At this point, the output of the AND-circuit 26 becomes a high level, due to the output of the AND-circuit 25 which is supplied with the high-level signal q and the output obtained through the inverting output terminal $\overline{Q13}$ of the T-type flip-flop circuit 23, and the signal k1 supplied from the shift register 21. Therefore, a load pulse r1 shown in FIG. 3(O) is produced from the OR-circuit 27. The counters 11 through 18 are respectively set, since the above load pulse r1 is supplied to the load terminals L1 through L8 of the counters 11 through 18. Accordingly, the preset data "11011101" which was present to the preset data input terminals P1 through P8, is produced as output through the output terminals Q1 through Q8 of the counters 11 through 18 (a data "00100010" is obtained through the inverting output terminals $\overline{Q1}$ through $\overline{Q8}$). Hence, the counters 11 through 18 are respectively returned to their original states, and the counting operation is started again from that point. Moreover, 190 pulses of the master clock signal a exist within the interval of the above signal m1. This can be seen from FIG. 2, as described above.

In the above described case, the preset data is set to $(N-5/2)$ instead of simply setting the preset data to $N/2$, and the signal supplied to the shift registers 21 and 22 are shifted by predetermined quantities. Accordingly, although delays exist in the outputs of the counters 11 through 18 corresponding to each stage of the counting operation, the delays respectively introduced at each of the stages are all forcibly matched with the output obtained through the inverting output terminal $\overline{Q1}$ of the counter 11, since each of the outputs supplied through the inverting output terminals $\overline{Q1}$ through $\overline{Q8}$ of the counters 11 through 18 are respectively applied to the AND-circuit 19. Thus, it is possible to positively return each preset value of the counters 11 through 18 to the preset values within the counting period in which the number of pulses is counted. Furthermore, it is also possible to synchronize the master clock signal a with the frequency-divided outputs m1 and m2 respectively obtained from the T-type flip-flop circuit 23 through an output terminal 31.

The load pulse r1 shown in FIG. 3(O) is still in a high-level state at the rising edge of the 190th pulse of the master clock signal a, due to the delay introduced in the circuit elements. Then, from the 191st pulse of the master clock signal a, the counters 11 through 18 which are respctively returned to their original states as described above, are operated similarly as in the above described case. That is, all the outputs obtained through the inverting output terminals $\overline{Q1}$ through $\overline{Q8}$ of the counters 11 through 18 become of high levels, when the 377th (188A-th) pulse of the master clock signal is applied to the counters. Accordingly, a coincidence signal j2 shown in FIG. 3(J) is obtained from the AND-circuit 19. Therefore, by shifting this coincidence signal j2 at the shift registers 21 and 22, signals k2 and l2 respectively shown in FIGS. 3(K) and 3(L) are obtained. When the above shifting operation is performed in the shift registers 21 and 22, the output signal l2 of the shift register 22 and the output signal of the AND-circuit 25 obtained through the inverting circuit 28 are respectively supplied to the AND-circuit 29. Hence, a load pulse r2 shown in FIG. 3(O) is produced from the OR-circuit 27, and the counters 11 through 18 are respectively returned to their original states. In this case, the 190th pulse is counted as the first pulse of the following count, that is, as the first (1A-th) pulse, since the counters 11 through 18 are respectively set by the load pulse r1. Therefore, 189 pulses of the master clock signal a exist within the interval of the frequency-divided output signal m2 shown in FIG. 3(M).

Figure 4:
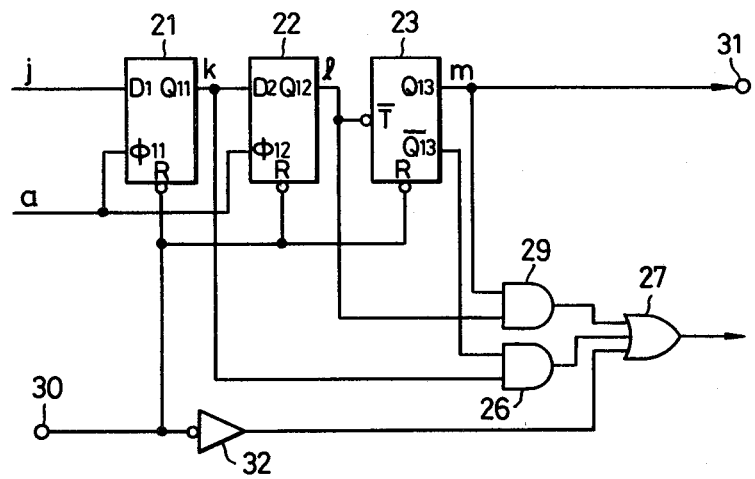
FIG. 4 is an equivalent circuit diagram of a circuit consisting of a shift register, a flip-flop circuit, and a logic circuit, in a case where an odd frequency-division is performed by use of a circuit according to the present invention.

By repeating the above described operations, a signal having a frequency which is 1/379 the frequency of the master clock signal a is produced through the output terminal 31. Moreover, an equivalent circuit diagram of a circuit consisting of the above shift registers 21 and 22, T-type flip-flop circuit 23, and the logic circuit 35 in a case where an odd frequency-division is to be performed, is shown in FIG. 4. In FIG. 4, those parts which are the same as those corresponding parts in FIG. 1 are designated by like reference numerals, and their description will be omitted.

Next, description will be given with respect to a case where the circuit shown in FIG. 1 is applied to a circuit for frequency-dividing the master clock signal a, wherein the demoninator N of the frequency-dividing ratio is an even number. In this case, the preset data n can be described by an equation $n=(N-4/2)$, and as in the above-described case where the demonianator N of the frequency-dividing ratio is an odd number, a value represented in binary code which corresponds to the value of the preset data, is preset in each of the preset data input terminals P1 through P8 of the counters 11 through 18. Moreover, a signal of low level, is applied to the odd/even number switching terminal 24.

Figure 5:
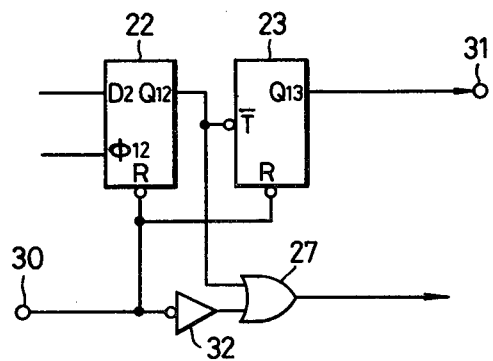
FIG. 5 is an equivalent circuit diagram of a circuit consisting of a shift register, a flip-flop circuit, and a logic circuit, in a case where an even frequency-division is performed by use of a circuit according to the present invention.

The output of the AND-circuit 25 is always of a low level in the above case, since the low-level signal is applied to the odd/even number switching terminal 24. In addition, a high-level output obtained through the inverting circuit 28 and the output signal of the shift register 22 are respectively supplied to the AND-circuit 29, and the load pulse is produced by the OR-circuit 27 as a result. Accordingly, as in the case where an odd frequency-division is to be performed, the above load pulse is supplied to the load terminals L1 through L8 of the counters 11 through 18, and an even frequency-divided output signal is obtained from the output terminal 31. Therefore, when an even frequency-divided output signal is to be obtained, the shift register 21 becomes unnecessary. The equivalent circuit diagram of a circuit comprising the shift registers 21 and 22, T-type flip-flop circuit 23, and logic circuit 35 shown in FIG. 1, becomes of a construction shown in FIG. 5. In FIG. 5, those parts which are the same as those corresponding parts in FIG. 1 are designated by like reference numerals, and their description will be omitted.

Accordingly, when a circuit is to only perform an odd or even frequency-division, the simply constructed circuits respectively shown in FIGS. 4 and 5 can be used instead of the circuit shown in FIG. 1 comprising the shift registers 21 and 22, T-type flip-flop circuit 23, and logic circuit 35.

Moreover, in the above embodiment of the invention described in conjunction with FIG. 1, the coincidence signal is obtained when the output signals obtained from the counters are all of low levels (when the inverted output signals obtained from the counters are all of high levels). However, the circuit can be constructed so as to obtain the coincidence signal when a value "2" or "3" in binary code is obtained from the above output signals of the counters. In this case, the time delay introduced in the counters can be reduced.

Furthermore, the circuit of the present invention is not only applicable to a musical scale signal generating apparatus of an electronic organ, and can be applied to circuits which obtain frequency-divided outputs by frequency-dividing a master clock signal at a desired frequency-dividing ratio. Further, this invention is not limited to this embodiment but various variations and modifications may be made without departing from the scope of the invention.

What is claimed is:

1. A frequency-dividing circuit comprising:
asynchronous counter means having a plurality of one-half frequency-dividers connected in series in a plurality of stages in which a master clock signal is applied to an input terminal of the initial stage, for asynchronously producing output signals of each one-half frequency-dividers, said asynchronous counter means being set with a preset data n (n is an integer) which is preset according to a desired frequency-dividing ratio when applied with a load pulse;
an AND-circuit for detecting the coincidence of a plurality of outputs supplied from said asynchronous counter means; and
frequency-divided output signal and load pulse generation means supplied with said master clock signal and an output signal of said AND-circuit, for generating a frequency-divided output signal and a load pulse, said frequency-divided output signal and load pulse generation means supplying a load pulse to said asynchronous counter means,
said frequency-divided output signal and load pulse generation means comprising a shifting circuit supplied with an output of said AND-circuit and the master clock signal, for shifting the signal supplied thereto by a predetermined quantity by being synchronized with the output of said AND-circuit and the master clock signal, a trigger-type flip-flop circuit for producing a frequency-divided output signal by reversing state in response to a final shifted output signal obtained from said shifting circuit, and a load pulse generation circuit supplied with the output signal of said shifting circuit and the frequency-divided output signal of said trigger-type flip-flop circuit, for producing the load pulse,
said shifting circuit having a first shift register supplied with the output of said AND-circuit and the master clock signal, and a second shift register supplied with an output of said first shift register and the master clock signal,
said trigger-type flip-flop circuit being supplied with an output of said second shift register.

2. A frequency-dividing circuit as claimed in claim 1 in which said load pulse generation circuit has an odd-/even number switching terminal to which a different signal is applied according to whether a denominator N (N is an integer) of the frequency-dividing ratio 1/N is an odd or an even number, and a reset signal input terminal connected to said shifting circuit and said trigger-type flip-flop circuit, said reset signal input terminal being supplied with a reset signal when said shifting circuit and said trigger-type flip-flop circuit are to be reset, said frequency-dividing circuit being switched over to produce an odd or even frequency-divided output signal according to the signal applied to said odd/even number switching terminal.

3. A frequency-dividing circuit as claimed in claim 2 in which said load pulse generation circuit comprises:
a first AND-gate supplied with an inverted output signal of said trigger-type flip-flop circuit and a signal obtained through said odd/even number switching terminal;
a second AND-gate supplied with an output signal of said second shift register and an output signal of said first AND-gate obtained through a first inverter;
a third AND-gate supplied with an output signal of said first shift register and an output of said first AND-gate; and
an OR-gate supplied with a reset signal obtained through said reset signal input terminal and a second inverter and the outputs of said second and third AND-gates, for producing the load pulse.

4. A frequency-dividing circuit as claimed in claim 2 in which said preset data n is described by an equation $n=(N-5/2)$ when the denominator N of the frequency-dividing ratio is an odd number, and described by an equation $n=(N-4/2)$ when N is an even number.

5. A frequency-dividing circuit as claimed in claim 1 in which a denominator N (N is an integer) of the frequency-dividing ratio 1/N is an odd number, and said load pulse generation circuit comprises:
a first AND-gate supplied with output signals of said second shift register and said trigger-type flip-flop circuit;
a second AND-gate supplied with an output signal of said first shift register and an inverted output signal of said trigger-type flip-flop circuit;
a reset signal input terminal connected to said first and second shift registers and said trigger-type flip-flop circuit, said reset signal input terminal being supplied with a reset signal when said first and second shift registers and said trigger-type flip-flop circuit are to be reset; and
an OR-gate supplied with outputs of said first and second AND-gates and the reset signal obtained through said reset signal input terminal and an inverter, for producing the load pulse.

6. A frequency-dividing circuit as claimed in claim 1 in which a denominator N (N is an integer) of the frequency-dividing ratio 1/N is an even number, and said load pulse generation circuit comprises:

a reset signal input terminal connected to said shifting circuit and said trigger-type flip-flop circuit, said reset signal input terminal being supplied with a reset signal when said shifting circuit and said trigger-type flip-flop circuit are to be reset, said load pulse generation circuit being further supplied with the reset signal obtained through said reset signal input terminal.

7. A frequency-dividing circuit as claimed in claim 6 in which said load pulse generation circuit has an inverting circuit for inverting said reset signal, and an OR-circuit supplied with outputs of said shifting circuit and said inverting circuit, for producing the load pulse.

* * * * *